United States Patent [19]

Chantre

[11] Patent Number: 5,367,184
[45] Date of Patent: Nov. 22, 1994

[54] VERTICAL JFET TRANSISTOR WITH OPTIMISED BIPOLAR OPERATING MODE AND CORRESPONDING METHOD OF FABRICATION

[75] Inventor: Alain Chantre, Saint Egréve, France

[73] Assignee: France Telecom, Paris, France

[21] Appl. No.: 87,427

[22] Filed: Jul. 2, 1993

[51] Int. Cl.[5] .................. H01L 29/161; H01L 29/205; H01L 29/225

[52] U.S. Cl. .................. 257/192; 257/616; 257/263

[58] Field of Search ............... 257/192, 616, 263, 264, 257/195

[56] References Cited

U.S. PATENT DOCUMENTS

| | | | |
|---|---|---|---|
| 4,460,910 | 7/1984 | Chappell et al. | 257/192 |
| 4,743,951 | 5/1988 | Chang et al. | 257/195 |
| 4,799,090 | 1/1989 | Nishizawa | 357/12 |
| 4,916,499 | 4/1990 | Kawai | 357/22 |

FOREIGN PATENT DOCUMENTS

| | | | |
|---|---|---|---|
| 0069606 | 6/1981 | European Pat. Off. | 257/192 |
| 3736009 | 10/1987 | Germany | 257/192 |

OTHER PUBLICATIONS

French Search Report for Application No. FR 9208179.
Kuriyama, Y. et al., "15 GBPS MUX/DMUX Implemented with AIGaAs/GaAs HBTS," IEEE GaAs Sumposium, Oct. 25, 1989, pp. 313–316.

*Primary Examiner*—Sara W. Crane
*Assistant Examiner*—Donald L. Monin, Jr.
*Attorney, Agent, or Firm*—Arnold, White & Durkee

[57] ABSTRACT

The vertical Junction field-effect transistor comprises a semiconductor structure including an internal semiconductor layer (23, 26) extending within the channel region (7) between the gate region (4, 31), this internal layer being produced in a semiconductor material, having an energy gap ($Eg^2$) smaller than that of the material forming the channel and gate regions, and the same type of conductivity (N) as that of the channel region, and the heterojunction formed between this internal layer and the channel region exhibits a band discontinuity situated in the valence band in the case of a N-type channel, or in the conduction band in the case of a P-type channel.

13 Claims, 6 Drawing Sheets

VERTICAL JFET TRANSISTOR WITH OPTIMISED BIPOLAR OPERATING MODE AND CORRESPONDING METHOD OF FABRICATION

The invention relates to semiconductor structures which are capable of forming a vertical junction field-effect transistor, which is furthermore capable of bipolar operation.

A conventional vertical Junction field-effect transistor, or more simply vertical JFET transistor, includes, by reason of the method of fabrication generally employed, a gate region which is implanted within a semiconductor substrate. The substrate possesses a first type of conductivity (N in the case of an N-channel JFET transistor) while the gate region has the opposite type of conductivity (P in the present case). The substrate at least partly incorporates the channel region, and, in its lower part, the drain region.

When, for example, the gate of an N-channel vertical JFET transistor is forward biased with respect to the source, the minority carriers (holes) injected into the channel region constitute an electrical "base" between the source (which acts as emitter) and the drain (which acts as collector). The transistor then operates in bipolar mode.

Such an operating mode, characterised by a very high transconductance, is particularly beneficial for high-speed applications.

The optimisation of this bipolar operating mode depends especially on the width of the base thus created. However, in currently existing transistor structures, it is not possible to control this width.

The invention aims to afford a more satisfactory solution to this problem.

An object of the invention is to optimise the bipolar operating mode of a vertical JFET transistor and thus especially to obtain a transistor with very high switching speed.

The object of the invention is also to provide such a transistor which can be simply fabricated with already existing technological resources.

Another object of the invention consists in minimising, or even suppressing, parasitic gate/substrate capacitances produced by the corresponding PN junction, which are usually formed within this transistor.

The object of the invention is also to minimise the parasitic drain/substrate capacitances.

Hence the invention provides a vertical junction field-effect transistor, comprising a semiconductor structure including a semiconductor internal layer extending within the channel region between the gate region, this internal layer being produced in a semiconductor material, having an energy gap smaller than that of the material forming the channel and gate regions, and the same type of conductivity as that of the channel region; moreover the heterojunction formed between this internal layer and the channel region exhibits a band discontinuity lying in the valence band in the case of a N-type channel (P-type gate), or in the conduction band in the case of a P-type channel (N-type gate).

The thickness of this internal semiconductor layer is advantageously of the order of a few tens of angstroms.

According to one embodiment of the invention, the material forming the gate region and the channel region is silicon, while the material forming the semiconducting internal layer is a silicon/germanium alloy. It is possible, however, to use a III-V material as the material forming the semiconductor internal layer, while the material forming the gate and channel regions may then be a ternary alloy of this III-V material.

According to one embodiment of the invention, the semiconductor structure of such a vertical junction field-effect transistor comprises an intermediate region, capable of forming the channel region, having a first type of conductivity, surmounting a first region capable of forming the drain region, included in the substrate, also having the first type of conductivity and advantageously overdoped with respect to the intermediate region. This intermediate region possesses a projecting part surmounted by a second region, capable of forming the source region, also having the first type of conductivity and advantageously overdoped with respect to the intermediate region. This semiconductor region also comprises a third region, capable of forming the gate region, having the opposite type of conductivity, advantageously overdoped, arranged on either side of a part of the intermediate region, and separated from the second region by an insulating separation, or spacers, arranged around the projecting part; the internal layer then extends within the intermediate region between the gate region.

So as to minimise, or even to suppress, parasitic gate/substrate capacitances the semiconductor structure advantageously includes an insulating layer arranged outside the channel region between the gate region and the substrate.

This insulating layer advantageously has a thickness at least equal to the width of the space charge region of a PN Junction which would be produced from the basic semiconductor material of the field-effect transistor. It may lie between about 0.2 $\mu$m and about 1 $\mu$m, preferably of the order of 0.5 $\mu$m.

When the transistor is produced based on silicon, the channel, source and drain regions advantageously include monocrystalline silicon, while the insulating layer is silicon dioxide and the gate region includes polycrystalline silicon.

In order to minimise the parasitic drain/substrate capacitances, it is particularly advantageous to provide a substrate on insulator.

Such a transistor may be used in a bipolar operating mode; in this case, the drain region constitutes the collector region, the source region, that of the emitter, and the gate region, that of the base.

The subject of the invention is also a method of fabricating a semiconductor structure capable of forming a field-effect or bipolar Junction transistor.

According to a first variant of this method, compatible with a fabrication technology of the BiCMOS type, a) on a semiconductor substrate including a first region having a first type of conductivity (for example N type), there is deposited a superficial layer made of a semiconductor material having the first type of conductivity and an energy gap smaller than that of the material of the first region, and able to form a heterojunction including a band discontinuity situated in the valence band, in the case in which the first type of conductivity is N and in the conduction band in the case in which the first type of conductivity is P, b) a part of this superficial layer is removed in order to lay bare the corresponding part of the substrate and thus delimit a layer known as internal layer, c) on the structure thus obtained there is deposited a stack including another layer of a semiconductor material identical to that forming the said first region, then an upper layer made of another semiconductor material also having the first type of conductivity, d) in an area situated on either side of the internal layer a part of the stack is removed as far as the upper vicinity of the said internal layer so as to form a projecting part including, in its upper part, a part of the upper layer forming a second region capable of constituting the source region, e) in the substrate, on either side of the projecting part, is implanted a third region, capable of forming the gate region, coming into contact with the internal layer and having a type of conductivity opposite to the first, for example P type, and insulating spacers are produced in contact with the sides of the projecting part, and f) at least a part of the first, second and third regions is metallised.

The semiconductor material forming the upper layer of the stack, intended to form the source or emitter region, is advantageously overdoped polycrystalline silicon.

According to an implementation of the method, in step e), first of all a first implantation of dopant is performed, intended to confer the second type of conductivity on the third region, then the spacers are arranged on either side of the projecting region and a second implantation of dopant is performed, intended to ensure a gradual overdoping of the gate region.

According to another variant of the method of fabrication according to the invention, a) on a semiconductor substrate containing a first region having a first type of conductivity, a stacking is formed, including a layer of a semiconductor material, having a type of conductivity opposite to the first, framed by two layers of insulating materials, b) in the stack is produced a main orifice extending as far as the first region, c) in this main orifice is formed an intermediate region from a semiconductor material having the first type of conductivity, an internal layer in a semiconductor material having the first type of conductivity and an energy gap smaller than that of the material of the first region and able to form a heterojunction including a band discontinuity situated in the valence band in the case in which the first type of conductivity is N and in the conduction band in the case in which the first type of conductivity is P, as well as a second region surmounting this intermediate region, also having the first type of conductivity.

d) the upper face of the semiconductor layer of the stack is uncovered in a region situated at a distance and outside the channel region, and e) metallisations are produced on at least a part of the first and of the second regions, as well as on at least a part of the uncovered semiconductor layer of the stack.

It is particularly advantageous to overdope the first and second regions as well as the semiconductor layer of the stack, so as to obtain a better electrical contact with the various metallisations, especially in the case in which the semiconductor structure is produced based on silicon.

According to one mode of implementing the method, the formation of the intermediate region, of the internal layer and of the second region comprises a first deposition by epitaxy of a first semiconductor layer in order to form the lower part of the intermediate region, followed by another deposition by epitaxy of the internal layer, then by a third deposition by epitaxy in order to form the upper part of the intermediate region, as well as the second region. These depositions by epitaxy may preferably be depositions by selective epitaxy within the main orifice.

The upper face of the semiconductor layer of the stack may be uncovered by an etching operation, such as a reactive ion etching operation.

In order to provide an access to the first region which is capable of forming the drain, the semiconductor layer deposited onto the first insulating layer in contact with the substrate is removed, in a predetermined auxiliary area situated at a distance from that in which the said main orifice will be produced; next the second insulating layer of the stack is deposited, in this auxiliary area there is produced an auxiliary orifice extending as far as the first region of the substrate, and in this auxiliary orifice is formed a contact region having the same type of doping as that of the first region.

Other advantages and characteristics of the invention will appear on examining the detailed description below and the attached drawings in which.

The structure and the fabrication method of a first embodiment of a N-channel vertical JFET transistor will now be described, although the invention can be applied to a P-channel JFET transistor, by reversing all the types of dopants with respect to what will now be described.

Figure 1:
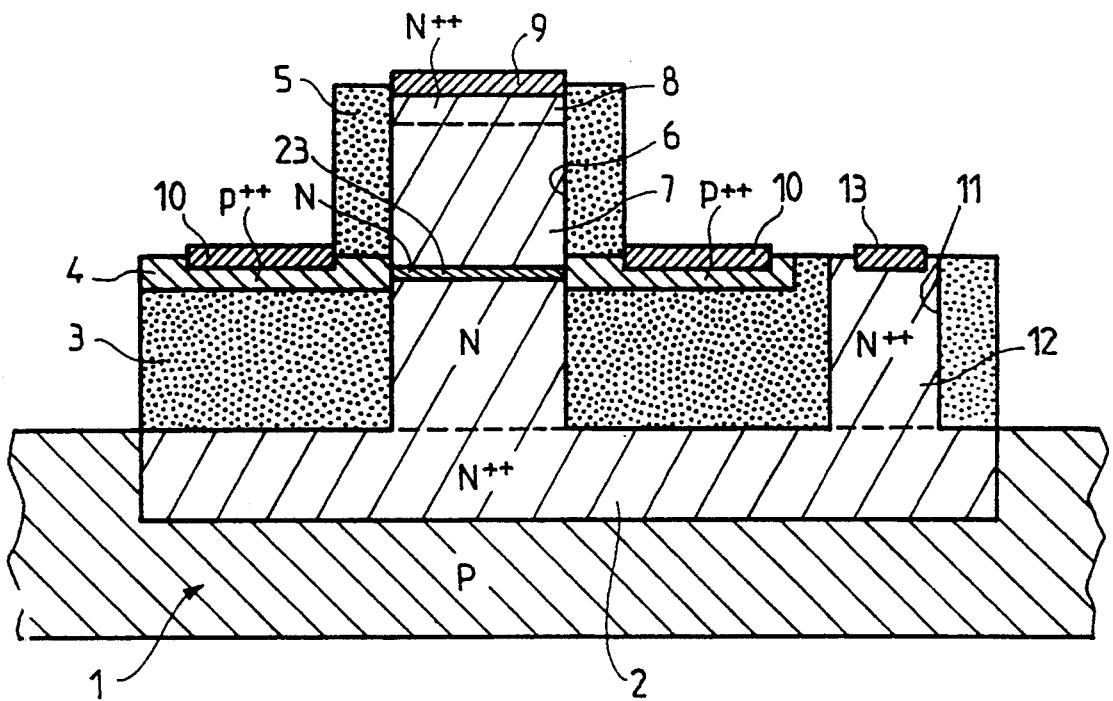
FIG. 1 is a diagrammatic section of a JFET transistor according to the invention.
Figure 4:
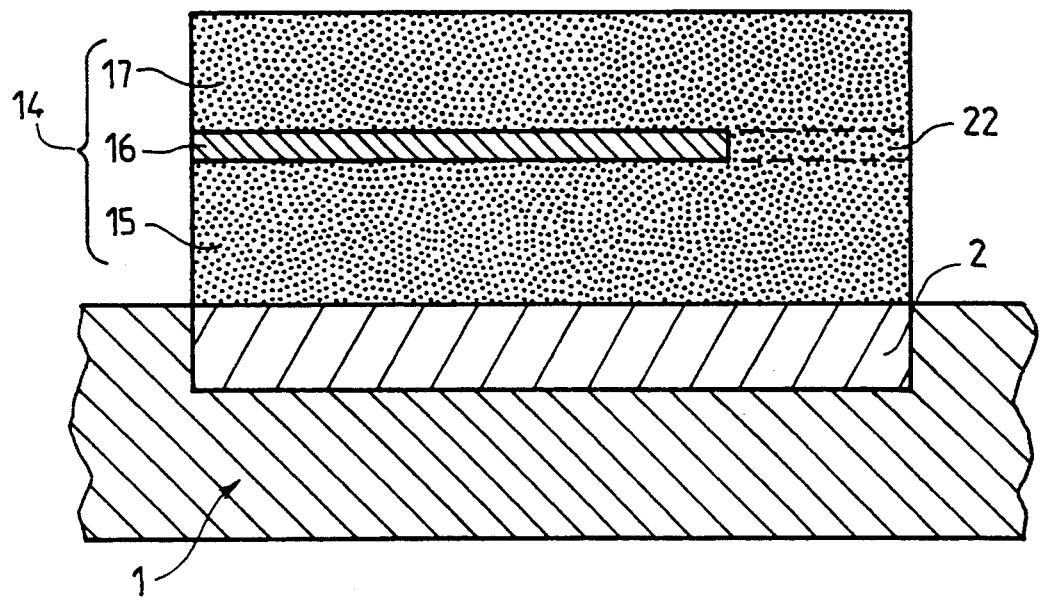
FIGS. 4 to 7 illustrate various steps of a first variant of the method of fabrication according to the invention.

In FIG. 1, reference 1 designates a solid substrate of silicon doped according to the P type of conductivity (conduction by holes). In this substrate is implanted a first region 2 having the opposite type of conductivity, that is to say N (conduction by electrons). This first region is overdoped N++, for example with a concentration of electrons of the order of $10^{20}$ cm$^{-3}$, with respect to a region 7 of N silicon in which the channel of the Junction transistor is capable of being formed. The concentration of electrons in the N-doped regions is of the order of $10^{17}$ cm$^{-3}$. This intermediate region, called channel region, 7 is surmounted by a second region 8, also having the N type of conductivity and also overdoped with respect to the channel region, on which a metallisation 9 is provided.

The regions 7 and 8 of the JFET transistor are situated (at least partly) within a main orifice 6 formed within a stack including a semiconductor layer 4, formed by overdoped polycrystalline silicon, having a thickness of the order of 1000 to 2000 Å and a type of conductivity opposite to that of the channel region, that is to say here P type. Under this semiconductor layer 4 is found a first insulating layer 3, substantially parallel to the upper face of the substrate 1, and extending as far as the latter, outside the lower part of the channel region 7. This first insulating layer is produced, for example, from silicon dioxide and has a thickness of the order of 0.5 to 0.7 μm.

Within the intermediate region 7 extends, between the overdoped P++ semiconductor layer 4, a layer 23 produced from a silicon/germanium alloy, $Si_{1-x}Ge_x$ with, for example, x=0.5. This layer 23 is a thin layer typically having a thickness of the order of a few tens of angstroms. This semiconductor layer is N doped like the intermediate region 7, called channel region.

Figure 2:
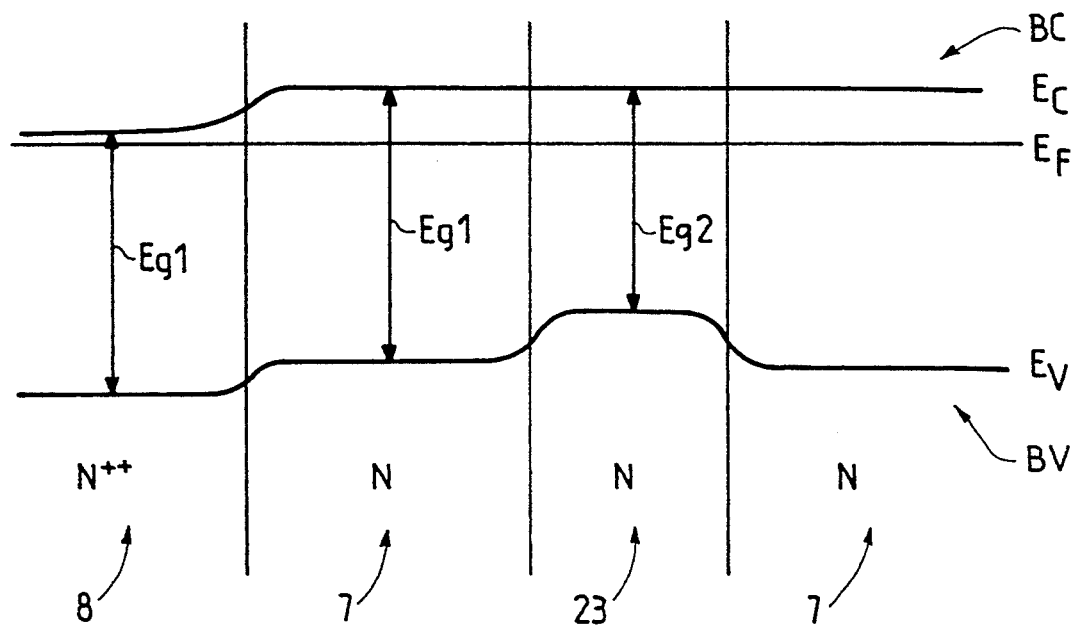
FIGS. 2 and 3 illustrate two energy band diagrams along two orthogonal directions, relating to the heterojunction formed within the transistor.

In a general way, the choice of the semiconductor materials has been made in order to obtain a heterojunction between this internal layer 23 and the so-called channel region 7, having an energy band diagram exhibiting, in the case of a N-channel vertical JFET transistor, a band discontinuity situated in the valence band. Such a diagram, obtained in the vertical direction, is illustrated in FIG. 2. Reference Ef designates the Fermi level, while reference Eg1 designates the energy gap between the low level Ec of the conduction band BC of the silicon and the high level Ev of the valence band BV of the silicon. Reference Eg2 itself designates the energy gap of the silicon/germanium alloy used. These two materials have substantially the same conduction band, but exhibit a difference in energy gap Eg2-Eg1 substantially equal to 0.37 eV for a $Si_{1-x}Ge_x$ alloy with x=0.5. As a consequence, in the region of the heterojunction a discontinuity in the valence band is obtained which is substantially equal to 0.37 eV.

In the case in which the transistor is a P-channel JFET, it would then be convenient to choose a pair of semiconductor materials such that this energy band diagram exhibits a band discontinuity in the conduction band.

Figure 3:
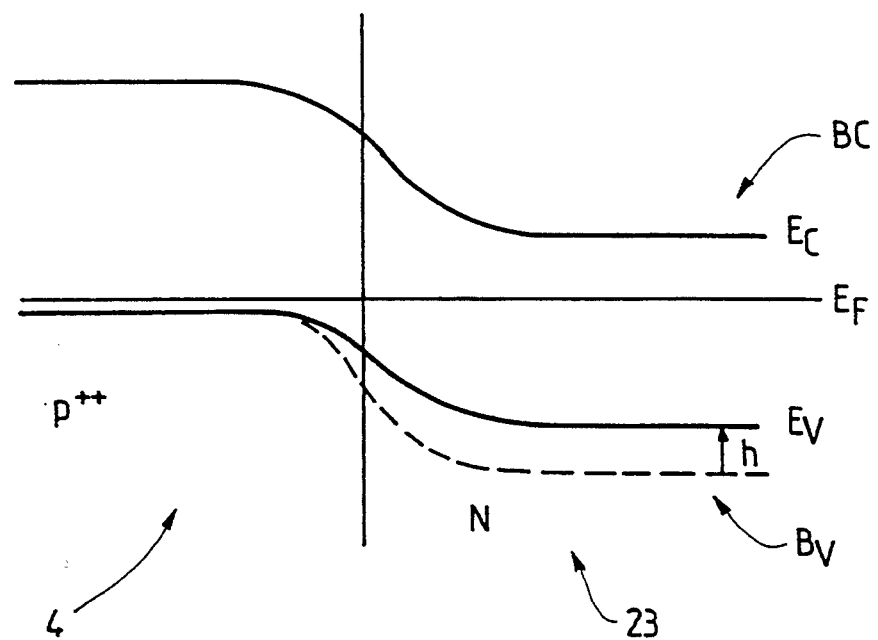
Figure 5:
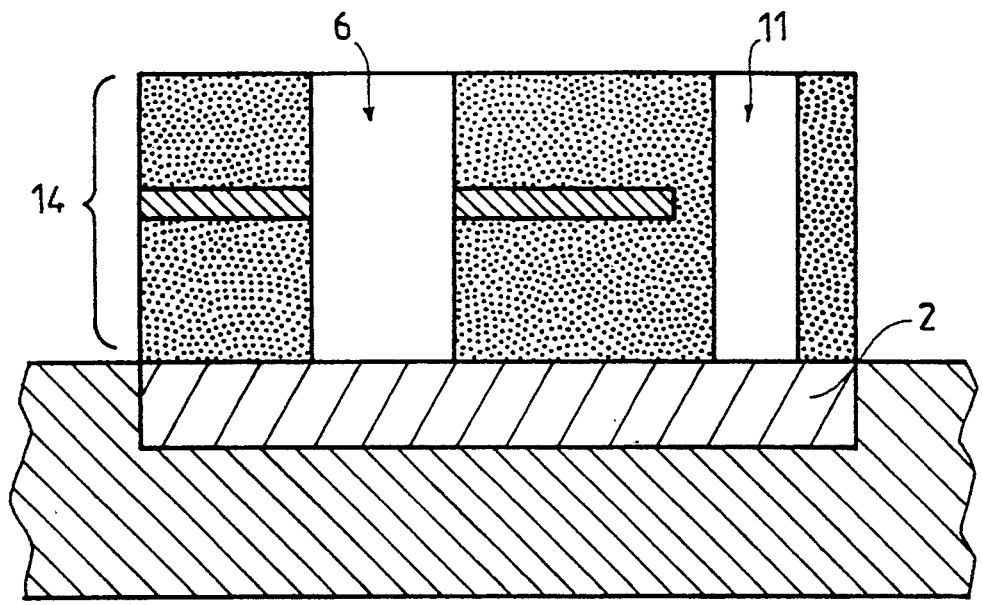

Corresponding to the energy band diagram obtained in the vertical direction, the energy band diagram along a horizontal direction, illustrated in FIG. 3, shows that the heterojunction between the semiconductor region 4 and the internal layer 23 exhibits a potential barrier height reduced by a height h, in the valence band, with respect to the potential barrier normally existing between a P++ N silicon junction.

The consequences of these energy band diagrams will be explained in more detail below in the context of the bipolar operation of the JFET transistor.

Needless to say it would be possible to use other pairs of semiconductor materials to produce such heterojunctions. The material forming the internal layer 23 could be a III-V material, that is to say a material including, in equal parts, an element from the third column and an element from the fifth column of the Mendeleev periodic classification, such as an alloy of gallium arsenide. The material forming the semiconductor region 4 as well as the intermediate channel region 7, would then be a ternary alloy of this material, such as, for example, a GaAlAs alloy.

Around the upper projecting part of the structure incorporating a part of the channel region 7 as well as the second region 8, there are provided insulating spacers 5 also produced, for example, from silicon dioxide. These spacers have the particular function of separating the second region 8 from the region 4 on which there is also provided a metallisation 10 extending as far as the spacers 5.

An auxiliary orifice 11 is formed in an auxiliary area of the transistor, situated at a distance from that in which the main orifice 6 is found. This auxiliary orifice is filled by overdoped N-type silicon, forming a region 12 coming into contact, in its lower part, with the buried region 2, and surmounted by a metallisation 13. It will be noted here that the extremity of the semiconductor layer 4 is situated at a distance from the region of opposite conductivity 12 contained in the orifice 11.

When this semiconductor structure is used as a Junction field-effect transistor, the semiconductor layer 4 constitutes the gate region with the gate contact 10, the overdoped region 8 forms the source region with the source contact 9, while the part of the region 2, situated under the channel region 7, forms the drain of the transistor linked to the drain contact 13 by the region 12 contained in the auxiliary orifice 11.

The diameter of the orifice 6 has been taken to be less than about 1 μm, which makes it possible, in this embodiment, having regard to the doping used, to have a significant overlap of the space charge regions of the gate/source junctions in the presence of a zero gate/source bias voltage $V_{GS}$, so as to ensure the blocking of the transistor (transistor normally OFF). Needless to say, the person skilled in the art will understand that it is possible to adjust the diameter of the orifice to different values, as a function of the material used and of its doping in order to obtain the blocking condition at zero $V_{GS}$. Moreover, it is possible to envisage, in certain applications, producing a normally ON transistor. The person skilled in the art will then know how to adjust the diameter of the orifice 6.

Such a transistor can also be used in bipolar operation. In this case, the drain, source and gate regions of the field-effect transistor constitute respectively the collector, emitter and base regions of the bipolar transistor. Needless to say, the use of this N-channel JFET transistor in the bipolar operating mode makes it necessary to forward-bias the gate region with respect to the source region, that is to say to provide a gate/source voltage greater than about 0.7 volt.

In the bipolar-mode of operation, the energyband diagrams illustrated in FIGS. 2 and 3 have essentially two essential consequences:

the injection of the minority carriers (holes in the present case) from the gate (base) region is focused in the internal layer 23, by virtue of the reduced barrier height. The effectiveness of injection into this layer is multiplied by a factor which is an exponential function of the ratio of the energy gap discontinuity Δ eV over the product of the Boltzmann's constant and temperature. This factor is of the order of $10^6$ for a temperature of 300° K. and for a $Si_{1-x}Ge_x$ (x=0.5) alloy, with respect to injection into the surrounding channel region;

the minority carriers (holes) injected into the layer 23 remain confined there by virtue of the potential barriers with the adjacent silicon, brought about by the band discontinuity in the valence band (in the present case).

This heterostructure in the channel region thus makes it possible precisely to control the width of the base of the transistor in its bipolar operating mode, which is not possible in a conventional vertical JFET transistor. Moreover, the fact that this internal layer is doped like the intermediate channel region avoids the exodiffusion problems which would have a tendency to occur in the case of a non-uniform doping giving rise to a widening of this electrical base. It is thus possible to obtain bipolar transistors having extremely thin bases of the order of a few tens of angstroms, which makes it possible considerably to enhance the transport speed in the base and thus to obtain excellent dynamic performance characteristics.

This transistor has been produced on a solid P-type substrate, which especially makes it possible to isolate several transistors of the same type produced from the same P-type silicon chip. Needless to say, it would have been possible to produce this transistor from a solid N-type silicon substrate, into which the overdoped region 2 would have been implanted.

Moreover, the drain, source and gate regions here have been overdoped so as to obtain better electrical contact between the metal and the silicon used as base semiconductor. Nevertheless, it is possible to dispense with such an overdoping of these regions if a semiconductor material is used which makes it possible to obtain a satisfactory contact directly with the metallisations. Such materials exist among the III-V materials.

In a general way, the width of the first insulating layer 3 situated under the gate outside the region of the channel area, may be taken to be equal to the width of the space charge region of the PN junction existing between the gate area and the substrate in conventional vertical JFET transistors. In effect, the parasitic gate/substrate capacitance will already be reduced by virtue of the low dielectric constant of the insulator. Hence a minimum insulating layer thickness of the order of 0.2 $\mu$m will generally be used.

As far as the maximum value of this thickness is concerned, it will generally not exceed a value of 1 $\mu$m so as not to have too high a vertical resistance for access to the drain or the collector.

The method of fabricating the transistor of FIG. 1 will now be described in detail, referring more particularly to FIGS. 2 to 5.

The first step of this method consists in depositing on the substrate 1 (FIG. 2) in which the overdoped, N-type region 2 has been implanted, a stack 14 consisting of a first insulator layer 15 surmounted by a semiconductor layer 16 with a type of conductivity opposite to that of the region 2, which is itself surmounted by a second insulator layer 17.

In practice, the insulating layer 15, here consisting of silicon dioxide, is deposited first of all on the substrate 1, in a conventional way. Next polycrystalline silicon is deposited, which is overdoped in order to confer P-type conductivity to it, and next the second layer of insulator 17, here also consisting of silicon dioxide, is deposited on this polycrystalline silicon.

In the case in which it is desired to produce the drain contact on the front face of the transistor, a part of the semiconductor layer 16 is removed before carrying out deposition of the second layer of insulator 17, for example by reactive ion etching, in an auxiliary area 22.

Next the main orifice 6 is produced in the stack 14 (FIG. 3), for example by reactive ion etching, and possibly the auxiliary orifice 11 in the area 22 which is free from polycrystalline silicon 16. These orifices extend as far as the overdoped region 2. It will be noted here that the maximum thickness of 1 $\mu$m adopted so as not to confer too high a vertical resistance for access to the drain remains compatible with the production according to conventional techniques, an orifice 6 having a submicronic diameter.

The following step consists in forming, in the orifice 6, the channel region 7, the internal layer 23 and the region 8. For this purpose, N-type silicon is made to grow by selective epitaxy in the orifice 6 as far as the level of the semiconductor layer 16, then a layer of silicon/germanium is deposited so as to form the layer 23. This layer is surmounted by a new deposition of N-type silicon as far as the upper face of the stack and ionic implantation of phosphorus or of arsenic is carried out, for example, so as to obtain the overdoping of the region 8. A selective epitaxy is also carried out in the auxiliary orifice 11 followed by a phosphorus implantation so as to obtain the region 12.

The following step (illustrated in FIG. 5) consists in uncovering the upper face of the semiconductor layer 4 of the stack, in a region situated at a distance around the channel region 7, so as to produce the spacers 5 of chosen thickness. The rest of the stack, situated in the auxiliary area of the auxiliary orifice 11, has preferably been levelled off in the same plane as that containing the upper face of the semiconductor layer 4.

The final step of this method consists in producing the metallisations 9, 10 and 13 by a known technique of the salicide (self aligned silicide) type, which includes the deposition of a layer of metal (for example of titanium) in order to form a silicide on the semiconductor silicon areas (TiSi$_2$).

Although selective epitaxy has been used here to form the semiconductor regions within the orifices 6 and 11 of the transistor, it would have been possible to use simple epitaxy on the whole of the stack pierced by these orifices, followed by a step of etching so as to remove the superfluous semiconductor depositions.

Similarly, although it is preferable to carry out the operation of forming the spacers by etching, after the step of selective epitaxy within the orifice 6, it would be possible to conceive of the spacers 5 being produced first, then selective epitaxy being carried out within the orifice 6.

Figure 6:
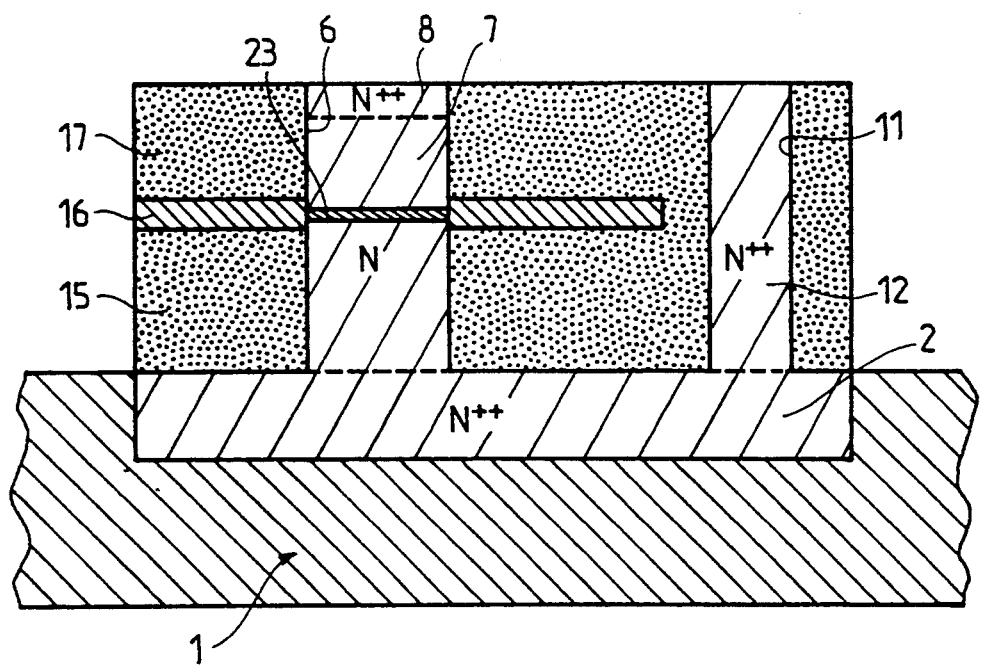
Figure 7:
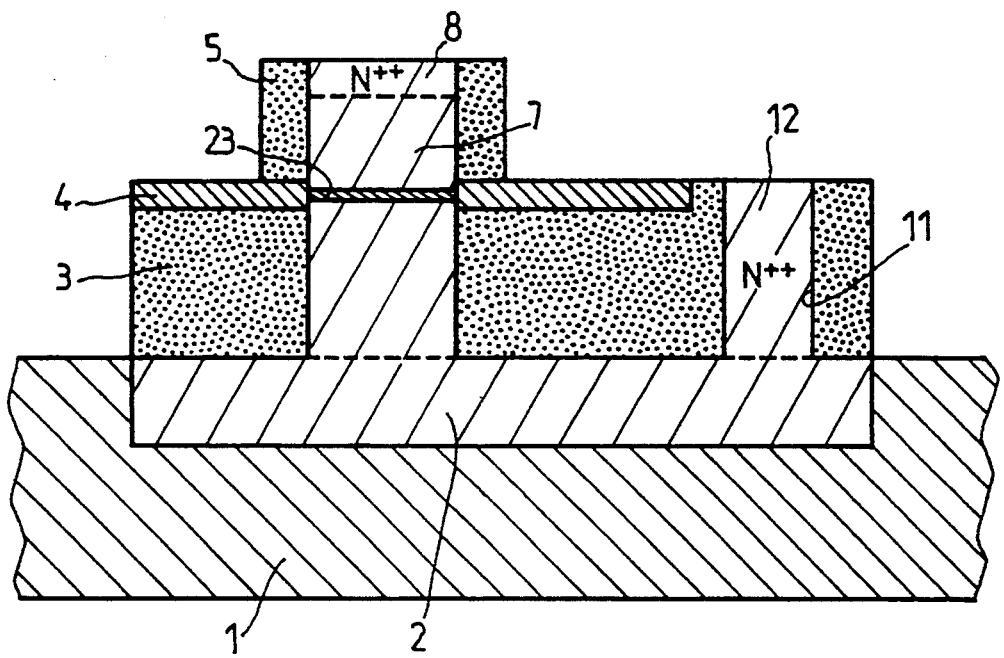
Figure 8:
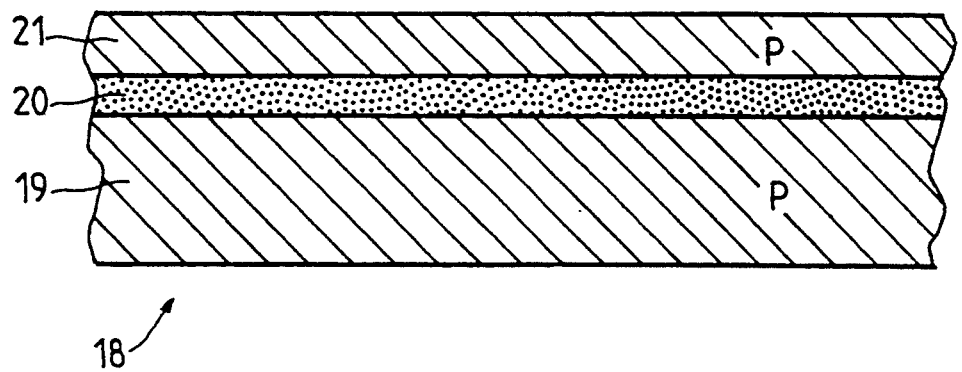
FIG. 8 illustrates another type of substrate used for fabrication of such a transistor.

Although the invention finds its full advantages in the embodiment described above, it proves to be yet further preferable to use a substrate on insulator, in certain applications, instead of a solid substrate, so as to minimise the parasitic drain/substrate or collector/substrate capacitances. Such a substrate on insulator 18 is illustrated diagrammatically in FIG. 6. It includes a lower region of silicon 19 surmounted by an insulating layer 20 of silicon dioxide, which is itself surmounted by another layer of silicon 21, of P or N type, playing the role of the substrate 1 illustrated in FIGS. 1 to 5.

The person skilled in the art knows such substrates under the title of SOI (silicon on insulator).

Figure 9:
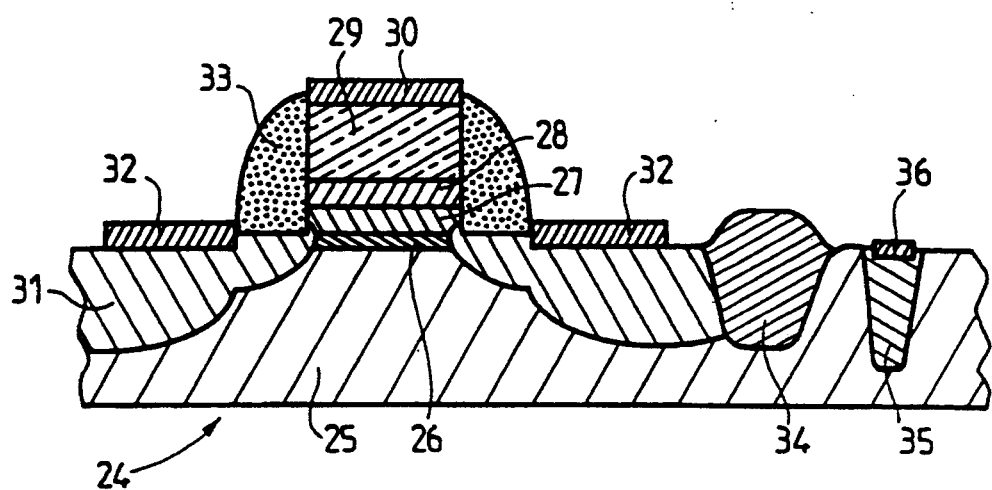
FIG. 9 illustrates another embodiment of a JFET transistor according to the invention.

Reference is now made more particularly to FIG. 9 to describe an embodiment of the transistor according to the invention, in a version which is compatible with CMOS fabrication technology (fabrication of complementary, insulated gate field-effect transistors on the same chip) or BiCMOS (addition of bipolar transistors).

In a N-type silicon substrate 24, including an overdoped drain region 25 in its lower part, there is a projecting part whose sides are covered with insulating spacers 33. This projecting part includes, at its peak, a metallisation 30 covering the region 29 which is capable of forming the source or the emitter, produced here in N++ overdoped polycrystalline silicon. Under this region 29 is situated a layer 28 of N++ overdoped N-type silicon which has in fact been obtained during the high-temperature diffusion phase of the structure. A layer 27 of N silicon is situated under this overdoped layer 28 and above the internal layer 26 formed by a silicon/germanium alloy.

This internal layer 26 extends between the P-type gate regions 31, implanted within the substrate 24. These regions are surmounted by a metallisation 32.

The drain contact 35, produced from N++ overdoped silicon, and covered by a metallisation 36, is separated from the gate region 31 by an insulating region 34, for example a silicon dioxide, implanted by the conventional Locos technique ("Local oxydation of silicon").

Figure 10:
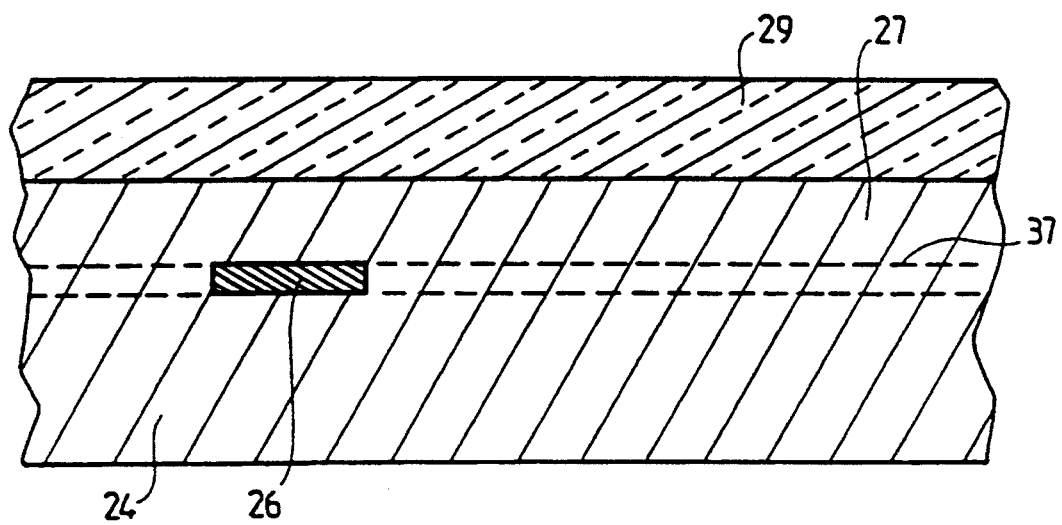
FIGS. 10 to 12 illustrate various steps of another variant of the fabrication method according to the invention.
Figure 11:
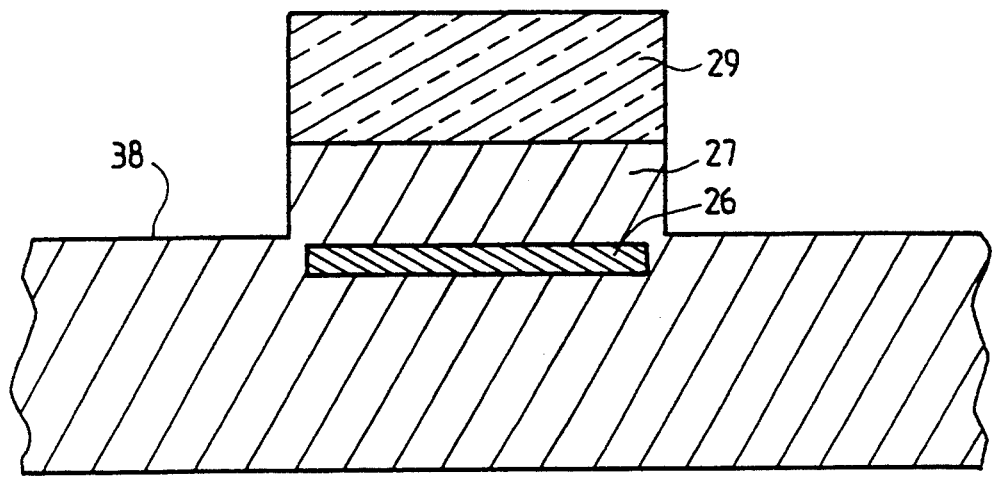
Figure 12:
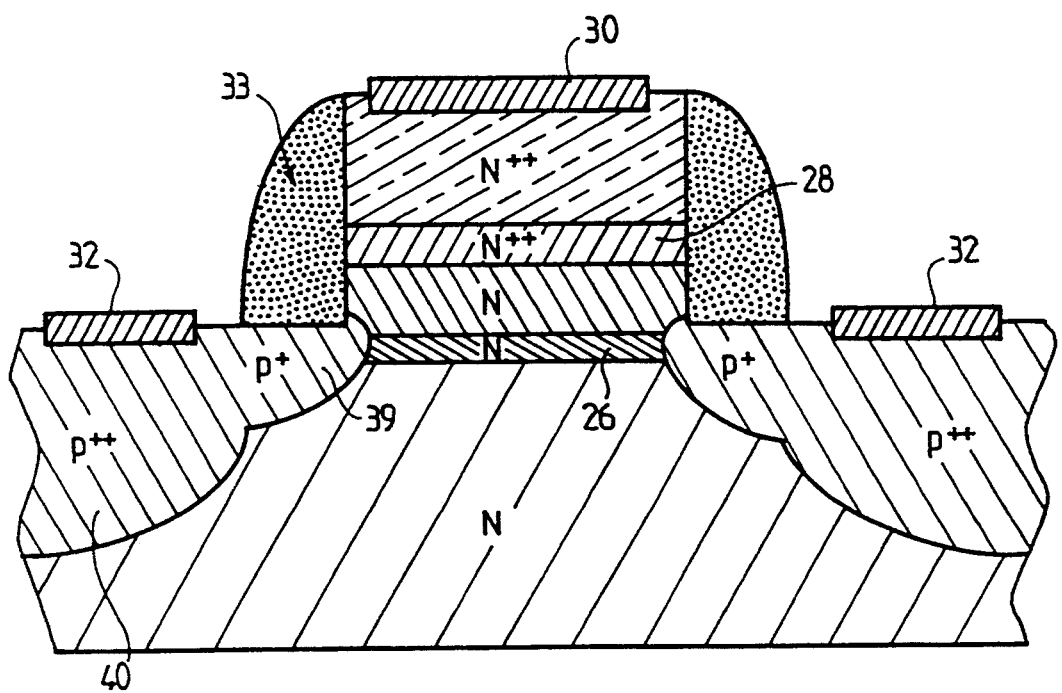

The method of fabricating such a structure, concerning essentially the formation of the internal layer 26, is illustrated in FIGS. 10 to 12.

On a semiconductor substrate 24 of N silicon, overdoped in its lower region, or even on a semiconductor substrate of P type in which a N well has been produced, a superficial layer of silicon/germanium is deposited, then a part of this superficial layer is removed in an area 37 in order to lay bare the corresponding part of the substrate and thus delineate the future internal layer 26.

Then, on the structure thus obtained, there is deposited a stack including a layer 27 of N-type silicon surmounted by a layer 29 of N-type polycrystalline silicon, which is overdoped so as to confer a N++ type overdoping on it.

Next, by etching in an area situated on either side of the internal layer 26, a part of the stack thus formed is removed as far as the upper vicinity of the internal layer 26 (FIG. 11), so as to form the projecting part of the heterojunction transistor.

Next, on either side of this projecting part, a first implantation of chosen dopants is carried out, so as to confer P-type conductivity on these implanted areas. Next the spacers 33 are produced, in contact with the sides of the projecting part, for example by deposition of silicon dioxide, followed by an anisotropic etching. Then a second implantation of dopants is carried out on either side of the projecting part equipped with the spacers, so as to obtain a gradual overdoping of the gate region (P+, P++), as illustrated by references 30 and 40 of FIG. 12.

The person skilled in the art will understand that such a transistor structure and its method of fabrication are compatible with the fabrication technology of the CMOS type, as they allow, at least in part, maskings to be used which are identical to those used during fabrication of these transistors.

I claim:

1. A vertical junction field-effect transistor, comprising:
    a semiconductor structure comprising an internal semiconductor layer extending within a channel region between portions of a semiconductive gate region, the internal semiconductor layer having a band gap smaller than that an other portion of the channel and smaller than the portions of the gate region, wherein the internal semi-conductor layer and the channel region are of a same conductivity; and
    a heterojunction formed between the internal semiconductor layer and the other portion of the channel region having a discontinuity in the valance band if the channel is an N-type channel or in a conduction band if the channel is a P-type channel.

2. The transistor of claim 1, wherein the thickness of the internal semiconductor layer is on the order of 10–100 angstroms.

3. The transistor of claim 1, wherein the gate and channel regions are formed of silicon, and the internal layer is formed of a silicon/germanium alloy.

4. The transistor of claim 1, wherein the internal layer is formed of a III-V material and the gate and channel regions are formed of a ternary alloy of the III-V material.

5. The transistor of claim 1, wherein the semiconductor structure comprises:
    a) an intermediate region forming the channel region and having a first type of conductivity, the intermediate region surmounting a first region forming a drain region included in a substrate that also has the first type of conductivity;
    b) a projecting part of the semiconductor structure incorporating a part of the channel region and a second region surmounting the channel region, the projecting part forming a source region and having the first type of conductivity;
    c) a third region forming the gate region and having a second type of conductivity, arranged on sides of the channel region and separated from the second region by an insulating separation arranged around the projecting part,
wherein the internal layer extends within an intermediate region between the gate region.

6. The transistor of claim 1, wherein the semiconductor structure comprises an insulating layer arranged outside the channel region between the gate region and a substrate.

7. The transistor of claim 6, wherein the gate region comprises a layer substantially parallel to the substrate and separated from the substrate by the insulating layer.

8. The transistor of claim 6, wherein the insulating layer has a thickness at least equal to a width of a space charge region resulting from a junction of the gate region and the channel region.

9. A transistor of claim 6, wherein the insulating layer has a thickness lying between about 0.2 $\mu$m and about 1 $\mu$m.

10. The transistor of claim 6, wherein the channel, source and drain regions include monocrystalline silicon, the insulating layer includes silicon dioxide, and the gate region includes polycrystalline silicon.

11. The transistor of claim 5, wherein the drain, source and gate regions are heavily doped.

12. The transistor of claim 5, wherein the substrate comprises a substrate on insulator.

13. The transistor of claim 5, for use in a bipolar operating mode, wherein the drain, source and gate regions constitute respectively, the collector, emitter and base regions of a corresponding bipolar transistor.

* * * * *

UNITED STATES PATENT AND TRADEMARK OFFICE
CERTIFICATE OF CORRECTION

PATENT NO. : 5,367,184
DATED : November 22, 1994
INVENTOR(S) : Alain Chantre

It is certified that error appears in the above-indentified patent and that said Letters Patent is hereby corrected as shown below:

On the title page, item [54] and in column 1, line 2, in the title change "optimised" to --optimized--.

Signed and Sealed this

Fourteenth Day of February, 1995

Attest:

BRUCE LEHMAN

Attesting Officer

Commissioner of Patents and Trademarks